(12) United States Patent
Schmidt et al.

(10) Patent No.: US 11,772,179 B2
(45) Date of Patent: Oct. 3, 2023

(54) METHOD FOR PRODUCING A HIGH-TEMPERATURE RESISTANT LEAD FREE SOLDER JOINT, AND HIGH-TEMPERATURE-RESISTANT LEAD-FREE SOLDER JOINT

(71) Applicant: Endress+Hauser SE+Co. KG, Maulburg (DE)

(72) Inventors: Elke Schmidt, Bad Säckingen (DE); Dietmar Birgel, Schopfheim (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 519 days.

(21) Appl. No.: 17/258,266

(22) PCT Filed: Jun. 13, 2019

(86) PCT No.: PCT/EP2019/065433
§ 371 (c)(1),
(2) Date: Jan. 6, 2021

(87) PCT Pub. No.: WO2020/007583
PCT Pub. Date: Jan. 9, 2020

(65) Prior Publication Data
US 2021/0268593 A1 Sep. 2, 2021

(30) Foreign Application Priority Data
Jul. 6, 2018 (DE) ...................... 10 2018 116 410.6

(51) Int. Cl.
*H05K 1/00* (2006.01)
*H05K 1/02* (2006.01)
(Continued)

(52) U.S. Cl.
CPC ........ *B23K 1/0016* (2013.01); *B23K 35/0238* (2013.01); *B23K 35/0244* (2013.01);
(Continued)

(58) Field of Classification Search
CPC . H05K 1/00; H05K 1/02; H05K 1/111; H05K 1/113; H05K 1/181; H05K 3/0016;
(Continued)

(56) References Cited

U.S. PATENT DOCUMENTS

| 4,044,888 A | * 8/1977 | Schachter .......... H05K 13/0465 439/85 |
| 6,342,442 B1 | 1/2002 | Angst et al. |

(Continued)

FOREIGN PATENT DOCUMENTS

| CN | 104203490 A | 12/2014 |
| DE | 258314 A1 | 7/1988 |

(Continued)

OTHER PUBLICATIONS

H.M Daoud, S. Reichelt & A. Loidolt, Preform-based diffusion soldering for use under conventional soldering process Parameters. In: 2017 21st European Microelectronics and Packaging Conference (EMPC) & Exhibition, Warsaw, Poland, 2017,—ISBN 978-0-9568086-4-6 (E); 978-1-5386-2309-1 (P). DOI: 10.23919/EMPC.2017.8346889. URL:https://ieeexplore.ieee.org/stamp/stamp.jsp? tp=&arnumber=8346889.

*Primary Examiner* — Xiaoliang Chen
(74) *Attorney, Agent, or Firm* — Mark A. Logan; Endress+Hauser (USA) Holding, Inc.

(57) ABSTRACT

Disclosed is a method for producing a high-temperature-resistant, lead-free solder joint between a circuit board and a part, wherein a lead-free solder preform is used that has a composite material having a first composite component arranged substantially in layers and wherein the part is soldered with the solder preform in a hot-bar selective soldering process. Also disclosed is a high-temperature-resistant, lead-free solder joint and a field device of automation technology for determining and/or monitoring the
(Continued)

process variable of a medium with a high-temperature-resistant, lead-free solder joint.

16 Claims, 2 Drawing Sheets

(51) Int. Cl.
*H05K 3/16* (2006.01)
*H01L 21/78* (2006.01)
*H01L 23/48* (2006.01)
*H01L 23/482* (2006.01)
*B23K 1/20* (2006.01)
*B23K 1/00* (2006.01)
*B23K 35/02* (2006.01)
*B23K 35/26* (2006.01)
*B23K 35/30* (2006.01)
*H05K 1/18* (2006.01)
*H05K 3/34* (2006.01)
*B23K 101/36* (2006.01)

(52) U.S. Cl.
CPC .......... *B23K 35/262* (2013.01); *B23K 35/302* (2013.01); *H05K 1/181* (2013.01); *H05K 3/3478* (2013.01); *H05K 3/3494* (2013.01); *B23K 2101/36* (2018.08)

(58) Field of Classification Search
CPC .. H05K 3/0465; H05K 3/3405; H05K 3/3415; H05K 3/3421; H05K 3/3431; H05K 3/3436; H05K 3/3468; H05K 3/4015; H01L 21/78; H01L 21/563; H01L 21/6836; H01L 23/48; H01L 23/482; H01L 23/3157; H01L 24/05; H01L 24/11; H01L 24/13; H01L 24/16; H01L 24/28; H01L 24/29; H01L 24/30; H01L 24/31; H01L 24/32; H01L 24/33; H01L 24/34; H01L 24/37; H01L 24/83; H01L 24/94; H01L 24/95; H01L 2224/03444; H01L 2224/8181; H01L 2224/11464; H01L 2224/13026; H01L 2224/16157; H01L 2224/16225; H01L 2224/17106; H01L 2224/29082; H01L 2224/29565; H01L 2224/95085; H01L 2224/951; B23K 1/0016; B23K 1/20; B23K 35/0238; B23K 35/0244; B23K 35/0684; B23K 35/262; B23K 35/302
USPC ............. 361/760, 767; 174/261, 262, 126.1; 439/78, 83, 85, 387; 29/840, 874
See application file for complete search history.

(56) References Cited

U.S. PATENT DOCUMENTS

| | | | |
|---|---|---|---|
| 2004/0050904 A1* | 3/2004 | Interrante | B23K 35/262 228/56.3 |
| 2007/0089811 A1 | 4/2007 | Ikeda et al. | |
| 2011/0220704 A1 | 9/2011 | Liu et al. | |
| 2013/0122725 A1* | 5/2013 | Chen | H01R 12/00 439/83 |
| 2015/0138742 A1* | 5/2015 | Nguyen | H05K 1/111 361/767 |
| 2015/0223346 A1* | 8/2015 | Serre | H01L 24/32 228/180.22 |
| 2016/0218074 A1* | 7/2016 | Seddon | H01L 24/31 |
| 2017/0173718 A1 | 6/2017 | Huang et al. | |
| 2019/0189581 A1* | 6/2019 | Subramani | H01L 24/16 |

FOREIGN PATENT DOCUMENTS

| | | |
|---|---|---|
| DE | 10201209 A1 | 7/2003 |
| DE | 102005043279 A1 | 3/2007 |
| DE | 102010002150 A1 | 8/2011 |
| DE | 102016110413 A1 | 12/2016 |
| DE | 102015219072 A1 | 4/2017 |
| EP | 1488880 A2 | 12/2004 |
| EP | 3266558 A1 | 1/2018 |

* cited by examiner

METHOD FOR PRODUCING A HIGH-TEMPERATURE RESISTANT LEAD FREE SOLDER JOINT, AND HIGH-TEMPERATURE-RESISTANT LEAD-FREE SOLDER JOINT

CROSS-REFERENCE TO RELATED APPLICATIONS

The present application is related to and claims the priority benefit of German Patent Application No. 10 2018 116 410.6, filed on Jul. 6, 2018 and International Patent Application No. PCT/EP2019/065433, filed on Jun. 13, 2019, the entire contents of which are incorporated herein by reference.

TECHNICAL FIELD

The invention relates to a method for creating a high-temperature-resistant lead-free solder joint between a printed circuit board and a component. The invention further relates to a high-temperature-resistant lead-free solder joint and to a field device of automation technology having a high-temperature-resistant lead-free solder joint.

BACKGROUND

Soldering is a thermal process by which an integral joint is obtained, either by melting a solder (fusion soldering) or by diffusion at the interfaces (diffusion soldering). Printed circuit boards having components soldered thereon are used in the field devices of automation technology produced and sold by the Endress+Hauser group in a wide variety of embodiments. In principle, all measuring devices for determining and/or monitoring process variables which are used close to the process and supply or process process-relevant information are referred to as field devices within the scope of this application. These are, for example, fill-level measuring devices, flow meters, pressure and temperature measuring devices, pH-redox potential meters, conductivity meters, etc., which are used for recording the respective process variables, such as fill level, flow, pressure, temperature, pH level, and conductivity. In field devices, particularly high requirements are imposed on certain components or their solder joints, due to their use close to the process, since they are, for example, subjected essentially directly to the ambient temperatures.

Different soldering methods are known from the prior art, the selection of which is determined by the application (especially the components to be soldered, the solder and/or the temperature range present during intended use). A classification is carried out according to the liquidus temperature of the solder: At a liquidus temperature below 450° C., a so-called soft solder joint is present, by definition; starting at 450° C., this is referred to as a hard solder joint since the latter generally have higher mechanical strength.

A soldering method widely used in industrial production lines for producing printed circuit boards is reflow soldering, in which so-called surface mounted devices (for short: SMD components) are soldered with their contacts directly to provided terminals. For this purpose, the SMD components are placed mechanically by way of pick-and-place machines on the contacts on the printed circuit board, which are provided with soldering paste, and soldered on using a reflow soldering process in a reflow soldering furnace. With this, a plurality of solder joints, typically soft solder joints, are created at the same time.

In addition to the SMD components, there are special components that, due to their function, have larger dimensions. These components are preferably designed as through-hole technology components-THT components for short. THT components are typically soldered in a wave soldering process. In the process, the printed circuit board is passed over a so-called solder wave, which is generated by pumping liquid solder through a narrow gap.

In order to integrate THT components into a manufacturing process dominated by a large number of SMD components, the method known as backside reflow soldering and described, for example, in patent specification DE 102 11 647 B4 is preferably used. With backside reflow soldering, THT components arranged on the first surface are soldered upside down, starting from the second surface of the printed circuit board, together with SMD components arranged on the second surface, in a shared reflow process. This makes it possible to cost-effectively produce double-sided mixed-assembly printed circuit boards.

In the event that not all components can be integrated into a shared reflow soldering process, selective soldering methods are used in which a soldering point can be individually processed in a targeted manner. As a result, the thermal load on the entire assembly is reduced and, if necessary, melting of already existing solder joints is prevented. DE 10 2006 035 528 A1 discloses, for example, the selective wave soldering of temperature-sensitive THT components. Selective wave soldering is a special case of the aforementioned wave soldering process. Further selective soldering methods known from the state of the art include soldering with a soldering iron, light soldering methods, for instance using a laser or infrared radiation, induction soldering or soldering by means of microwaves, and the hot-bar selective soldering method in which a bar is pressed onto the soldering point, and the predefined soldering temperature is achieved by means of an electric current flowing through the bar. Automated soldering machines which are designed for hot-bar selective soldering are manufactured and sold, for example, by the company "Eutect."

Furthermore, the use of solder preforms in the case of selective soldering processes is known from the prior art. DE 10 2012 200 021 A1 proposes, for example, the use of a solder preform with which the terminal pins of a THT component are soldered in a selective wave soldering process. DE 10 2006 021 335 A1 discloses the use of a solder preform for bridging connecting surfaces required for test purposes. In this case, the solder preform has a higher melting temperature than the soldering temperature of the reflow-soldered components and can therefore be soldered in a selective soldering process.

The soldering temperature is determined on the one hand by the solder; for example, the use of lead-free solders having higher melting points is become more wide-spread due to heavy metal-limiting regulations. On the other hand, it must be ensured that certain components or their solder joints also withstand the maximum temperatures present when the field device is used as intended. These components are the aforementioned components arranged close to the process, which are essentially directly exposed to the ambient temperatures. For field devices used in high-temperature applications, the solder joints arranged close to the process therefore must be protected from remelting even when in contact with very high ambient temperatures (for example above 150° C.). In addition, sufficient mechanical strength of the solder joints with respect to the vibrations occurring in a process system is required.

High-temperature-resistant solder joints are created in the prior art, for example, by means of diffusion soldering. During diffusion soldering, a surface alloy is produced, but the workpiece is not melted down deep. Diffusion soldering is distinguished by the formation of intermetallic phases, especially, over the entire thickness of the solder joint, whereby the solder joint has particularly high mechanical strength. Since diffusion soldering in principle requires very long soldering times (for example, in typical applications, up to 30 minutes), this soldering technique is disadvantageous for industrial production lines.

Recently, a novel lead-free solder preform made of a composite material with which a high-temperature-resistant solder joint can be obtained was developed. The solder preform is described in the scientific article "Preform-based diffusion soldering for use under conventional soldering process parameters" by H. M. Daoud et al. (*European Microelectronics and Packaging Conference (EMPC) & Exhibition, DOI* 10.23919/EMPC.2017.8346889), under the name PFDS400® and comprises a first composite component made of a tin-containing solder alloy, which is arranged in a copper matrix forming the second composite component. The tin-containing solder alloy is arranged in layers or coatings in the copper matrix. The solder preform is preferably oriented during soldering in such a way that the layers or coatings are arranged essentially parallel to the two solderable surfaces of the components to be joined. The solder preform is characterized in that during soldering, especially, a soft soldering process, intermetallic phases are formed, which run along the layers of the tin-containing solder alloy. Due to the layered composition of the solder preform, the intermetallic phases are distributed substantially uniformly over the entire thickness of the solder joint. As a result, a solder compound having a very high remelting temperature of up to 400° C. and excellent mechanical resistance is obtained. In the scientific article, it is proposed to combine the solder preform with a conventional soft-solder mass soldering process, namely with a reflow soldering process described at the outset, having soldering temperatures of about 250° C. and soldering times of about 10 min. Since, in a reflow soldering process, the entire printed circuit board is exposed to the soldering temperature in the soldering furnace, this combination of soldering time and temperature, in practice, represents excessively high thermal stress for further components arranged on the printed circuit board or their solder joints.

SUMMARY

The object of the invention is therefore to provide a solution for obtaining a high-temperature-resistant lead-free solder joint on a printed circuit board with the lowest possible thermal load on the entire printed circuit board.

The object is achieved by a method for creating a high-temperature-resistant lead-free solder joint, a high-temperature-resistant lead-free solder joint, and a field device of automation technology comprising a high-temperature-resistant lead-free solder joint.

With regard to the method, the object is achieved by a method for creating a high-temperature-resistant lead-free solder joint between a printed circuit board and a component, in which
  a lead-free solder preform is used, comprising a composite material including a first composite component arranged substantially in layers;
  the solder preform is attached to a solderable surface of the printed circuit board in such a way that the layers of the first composite component extend substantially parallel to the solderable surface;
  the component is applied to the solder preform attached to the solderable surface, the component having a solderable first surface facing the solder preform; and
  the component is soldered to the solder preform in a hot-bar selective soldering process, comprising at least the following steps:
    pressing a bar onto a second surface of the component facing away from the solder preform;
    reaching a predefined soldering temperature by means of an electric current flowing through the bar, at the predefined soldering temperature a first surface of the solder preform facing away from the solderable surface being soldered to the solderable first surface of the component facing the solder preform and intermetallic phases being formed from the layers of the first composite component; and
    moving the bar away from the component.

The combination according to the invention of the solder preform with the hot-bar selective soldering process, or the use of the solder preform in the hot-bar selective soldering process, has the following advantages:

1. In the locally delimited hot-bar selective soldering process, further components arranged on the surface of the printed circuit board are protected from excessive thermal loading. The further components are, especially, SMD components, for example including more easily meltable plastic components which have been soldered onto the printed circuit board, for example, in a reflow soldering process preceding the hot-bar selective soldering process.
2. In the hot-bar selective soldering process, the temperature required for soldering the solder preform and for forming the intermetallic phases can be reached in a comparatively short time. A shorter soldering time is, in principle, desirable due to expedited production associated therewith. Furthermore, shorter soldering times at the same soldering temperature result in a further reduction of thermal stress, especially, for assemblies adjoining the high-temperature-resistant solder joint.
3. Pressing on the bar with a holding force exerts pressure on the soldering point. This supports or accelerates the formation of the intermetallic phases in the high-temperature-resistant solder joint, thus achieving a further advantageous reduction of the soldering time.
4. In the hot-bar selective soldering process, a movable bar is used, which allows high spatial precision to be achieved during the creation of the high-temperature-resistant solder joint.
5. The hot-bar selective soldering process is suitable for use in industrial production lines, and the attachment of the solder preform itself can be incorporated into a further method step in the production of the printed circuit board.

In one embodiment of the method according to the invention, a predefined soldering temperature of more than 200° C. is used in the hot-bar selective soldering process.

Especially, a predefined soldering temperature of less than 500° C. is used.

Preferably, a predefined soldering temperature between 250° C. and 400° C. is used.

In an advantageous embodiment of the method according to the invention, a soldering time which is less than one minute, especially, less than 30 seconds, is used in the hot-bar selective soldering process. The invention is especially suitable for industrial production lines in which shorter production times offer considerable savings. In addition, with such short soldering times, the assembly adjoining the high-temperature-resistant solder joint may essentially be subjected to almost no stress.

In a further embodiment of the method according to the invention, the attachment of the solder preform on the solderable surface of the printed circuit board comprises at least the following steps:

applying, especially, printing, soldering paste onto a designated contact surface on the solderable surface of the printed circuit board;

populating the provided contact surface comprising the soldering paste with the solder preform;

In a refinement of this embodiment, the attachment of the solder preform on the solderable surface of the printed circuit board comprises the following step:

soldering the solder preform to the contact surface in a soft soldering process.

In a further embodiment of the method according to the invention, the attachment of the solder preform on the solderable surface of the printed circuit board comprises the following step:

gluing the solder preform onto the solderable surface of the printed circuit board, especially, using a flux.

In a particularly advantageous embodiment of the method according to the invention, the attachment of the solder preform can be at least partially integrated into a shared pressure and/or populating and/or reflow process in which further components, especially, SMD components, are soldered onto the printed circuit board.

The solder preform itself is thus attached to the solderable surface of the printed circuit board by means of soldering paste, for example within the scope of the populating process, and is subsequently soldered on in a shared reflow process. In the event that the solder preform is glued to the solderable surface of the printed circuit board by means of flux, the adhesive bonding can be incorporated into the preparatory step of applying flux, which is standard in a reflow soldering process.

In a further embodiment of the method according to the invention, the hot-bar selective soldering process comprises the following step:

soldering a second surface of the solder preform facing the solderable surface to the solderable surface.

In this embodiment, the solder preform itself (optionally in addition to the preceding reflow soldering or adhesive bonding) is also soldered to the solderable surface in the hot-bar selective soldering process.

In one embodiment of the method according to the invention, a solder preform is used which, as the first composite component, comprises a tin-containing solder alloy, especially, having a liquidus temperature of the solder alloy of less than 250°, and, as the second composite component, comprises a metallic matrix, especially, a copper matrix. Reference is again made here to the aforementioned scientific publication by H. Daoud et al.

In a particularly advantageous embodiment of the method according to the invention, a plurality of high-temperature-resistant solder joints are created consecutively by displacing the bar in the plane of the printed circuit board and/or by displacing the printed circuit board, and by successively carrying out the steps of the hot-bar selective soldering process in each case with one component-solder preform pair.

In a further particularly advantageous embodiment of the method according to the invention, a plurality of high-temperature-resistant solder joints are created substantially simultaneously with a plurality of bars, in that the plurality of bars essentially simultaneously carry out the steps of the hot-bar selective soldering process in each case with one bar for one component-solder preform pair.

With regard to the solder joint, the object is achieved by a high-temperature-resistant lead-free solder joint which is obtained by the hot-bar selective soldering method according to the invention using the lead-free solder preform. The properties of the lead-free solder joint according to the invention can be discerned from the intermetallic layers, for example by means of a sectional image. On the other hand, the use of a hot-bar selective soldering method during the soldering of a component is clearly apparent based on the impression of the bar on the component.

In one embodiment of the solder joint, the solder joint has a plurality of intermetallic phases, which are essentially arranged in layers and substantially parallel to the solderable surface of the printed circuit board, wherein the intermetallic phases of the solder joint are distributed substantially uniformly in a direction perpendicular to the solderable surface.

In one embodiment of the solder joint, the proportion of the intermetallic phases in the solder joint is at least 5%, especially, at least 10%.

In one embodiment of the solder joint, the solder joint is resistant at ambient temperatures of up to at least 200° C., especially, up to at least 400° C.

With regard to the field device of automation technology, the object is achieved by a field device of automation technology for determining and/or monitoring the process variable of a medium, comprising at least one electronic unit, which includes a printed circuit board having electrical and/or electronic components soldered thereon, wherein the solder joint of at least one of the components with the printed circuit board is designed as a high-temperature-resistant solder joint according to the invention. Reference shall again be made here to the field devices of automation technology mentioned at the outset, which comprise a sensitive component designed for high-temperature use and arranged close to the process.

Field devices provided for high-temperature use include, for example, ceramic pressure sensors or vibronic point level switches in which the oscillatable unit is inductively driven by means of a coil. Of course, the invention is not limited to these examples of the field devices.

BRIEF DESCRIPTION OF THE DRAWINGS

The invention will be explained further with reference to the figures, which are not true-to-scale, wherein the same reference signs designate the same features. For reasons of clarity, or if it appears sensible for other reasons, previously-noted reference signs will not be repeated in the following figures. The following is shown.

DETAILED DESCRIPTION

Figure 1A:
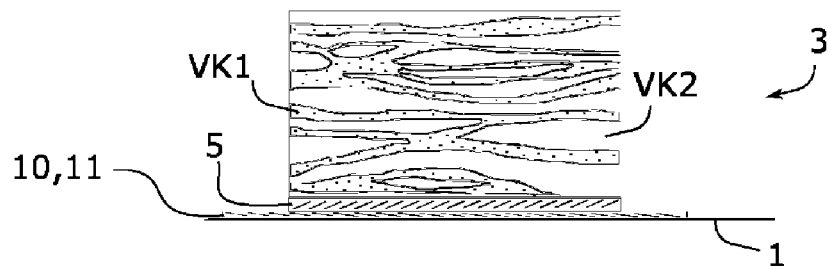
FIGS. 1a, 1b, 1c show a first embodiment of the method according to the present disclosure and an embodiment of the high-temperature-resistant solder joint.
Figure 1B:
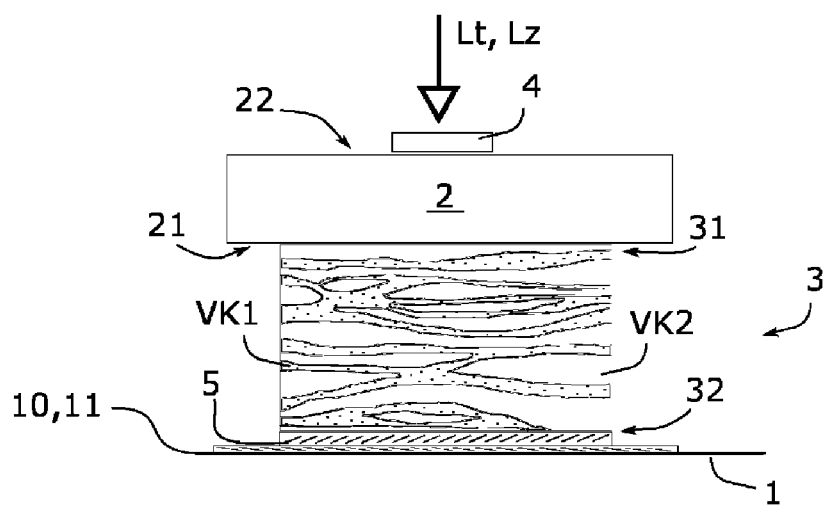
Figure 1C:
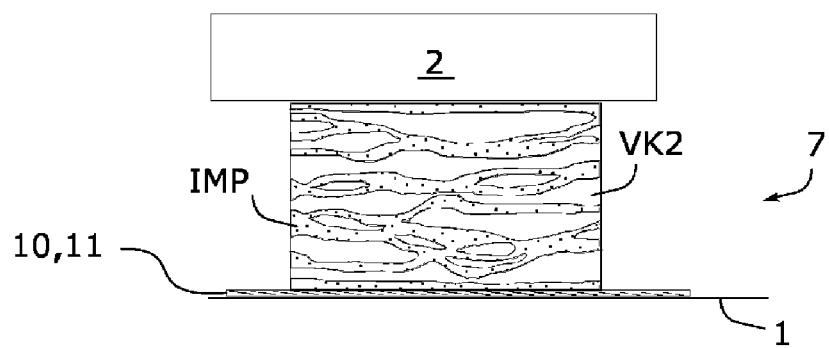

FIGS. 1a to 1c show in a sectional view the steps of the method according to the invention in an embodiment for a section of a printed circuit board 1, and a solder joint 7 obtained by the method. For the sake of enhanced illustration, the solder preform 3 is shown here in a considerably enlarged manner.

FIG. 1*a* shows a solder preform 3, which is made of the composite PFDS400, in which an Sn-containing solder alloy, serving as the first composite component VK1, is embedded in a substantially layered manner in a copper matrix forming the second composite component VK2. The solder preform 3 is applied to a solderable surface 11 of the printed circuit board 1 designed here as a contact surface 10 in such a way that the layers of the first composite component VK1 are arranged essentially parallel to the solderable surface 11. The layers comprising the Sn-containing solder alloy are shown here in dotted form.

In this embodiment, the solder preform 3 is applied to the solderable surface 11 by means of soldering paste 5. The soldering paste 5 and the solder preform 3 were advantageously applied in a process preceding the method according to the invention, for example within in the scope of a shared printing and populating process during the application of further components 61, 62 (shown in FIG. 2) designed as SMD components. In the process, the solder preform 3 itself was soldered on with a second surface 32 facing the solderable surface 11, especially, in a shared reflow process with the further components 61, 62. Alternatively, it is possible not to solder the solder preform 3 by means of reflow soldering, but only to adhesively bond it by means of flux. This step can also be incorporated into the reflow process, since a preparation step during reflow soldering comprises the application of flux.

Figure 3:
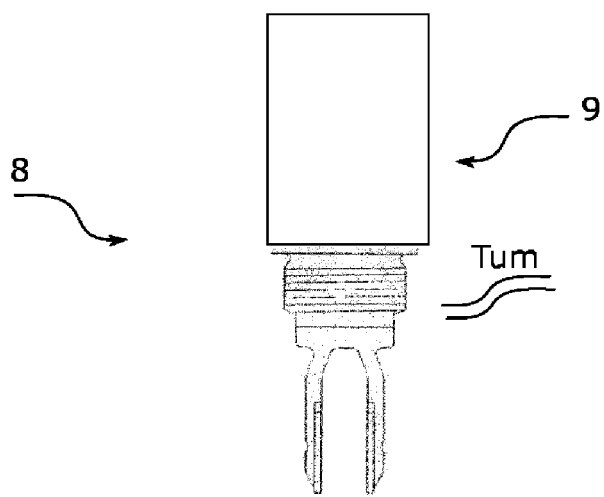
FIG. 3 shows an embodiment of a field device of automation technology comprising the high-temperature-resistant solder joint.

A component 2 is now applied to the solder preform 3. The component 2 has a first surface 21 facing the solder preform 3, for example made of brass. The component 2 is a special component 2, arranged close to the process, of a field device 8 of automation technology (the field device 8 is shown in FIG. 3) which, when used as intended according to the specification of the field device 8, can be exposed to particularly high ambient or process temperatures Tum, especially, temperatures above 150° C., for example between 180° C. and 200° C. It must therefore be ensured that the solder joint 7 of the component 2 also withstands these temperatures, that is to say is formed as a high-temperature-resistant solder joint 7. At the same time, the remaining assembly, especially, the further components 61, 62, should be exposed to the lowest possible thermal stress during their production.

This is achieved by means of the combination of the solder preform 3 with the hot-bar selective soldering method, in which a bar 4 is now pressed with a holding force onto the second surface 22 of the component 2 facing away from the solder preform 3, as is shown in FIG. 1*b*. A current flows through the bar 4 in order to thereby reach the soldering temperature Lt at which the intermetallic phases IMP form from the Sn-containing solder alloy arranged in layers. The intermetallic phases IMP formed during the soldering are thereby arranged in layers (shown in dotted manner), which run substantially parallel to the solderable surface. Thereafter, the bar 4 is moved away from the component 2.

The intermetallic phases IMP formed during the hot-bar selective soldering process have a remelting temperature of about 400° C., whereby the high temperature strength of the solder joint 7 is obtained. The intermetallic phases IMP arranged in layers, as is shown in FIG. 1*c*, not only limited to the interface between the solderable surface 11 and the second surface 32 of the solder preform 3 and to the interface between the first surface 31 of the solder preform 3 and the first surface 21 of the component, but are distributed substantially uniformly over the entire thickness of the solder joint 7 (i.e., in a direction perpendicular to the solderable surface 11). In the process, the layered intermetallic phases IMP account for a clearly recognizable portion on the entire solder joint 7. As a result, the solder joint 7 has excellent mechanical properties, for example high mechanical resistance to shear forces.

In the event that the solder preform 3 has been attached, especially, soldered, on the solderable surface 11 in a soldering process using soldering paste 5 which preceded the hot-bar selective soldering process, a homogeneous layer of an intermetallic phase IMP forms in the interface between the solderable surface 11 and the second surface 32 of the solder preform 3.

Also in the event that the solder preform 3 was only glued onto the solderable surface 11 by way of flux, the layer of the intermetallic phase IMP is formed in the interface between the solderable surface 11 and the second surface 32 of the solder preform 3 during hot-bar selective soldering.

During hot-bar selective soldering, the soldering temperature Lt is essentially only drastically limited in the vicinity of the component 2, i.e., locally, and only for the soldering time Lz. The total time required by the hot-bar selective soldering method, namely the displacement of the bar 4, the pressing on of the bar 3, the reaching and holding of the soldering temperature Lt, and the moving away of the bar 4, advantageously takes up a soldering time Lz of less than one minute. Supported by the holding force during the pressing-on of the bar, the intermetallic phases IMP required for the high-temperature strength of the solder joint 7 can form in the solder joint 7 even during this short time.

The short soldering time Lz and the localized, locally limited heating considerably reduce the thermal stress for further components 61, 62 that have already undergone reflow-soldering, so that remelting of their existing solder joints and/or melting of the components 61, 62 during the soldering of the high-temperature-resistant solder joint 7 is essentially precluded.

Figure 2A:
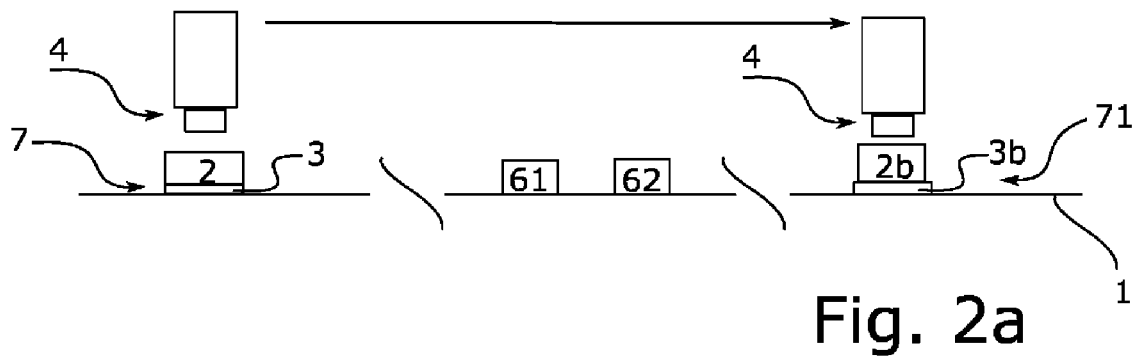
FIGS. 2a, 2b show a second embodiment of the method according to the present disclosure.
Figure 2B:
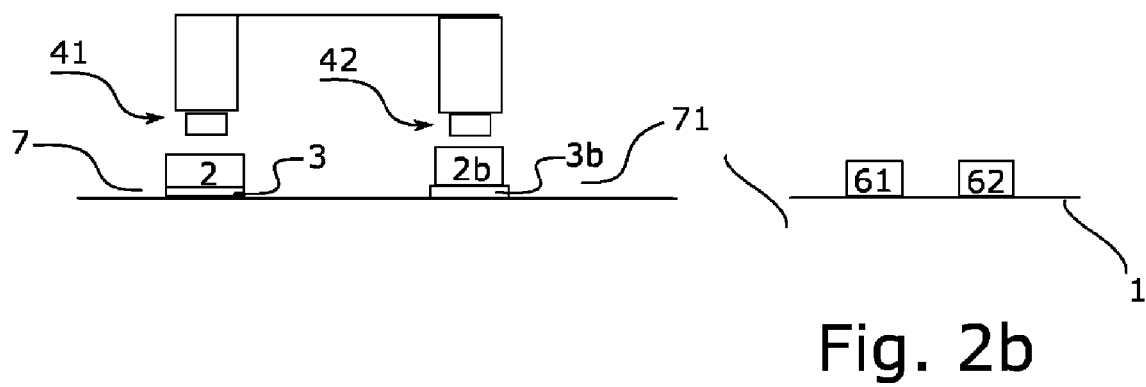

Of course, it is also possible to create a plurality of high-temperature-resistant solder joints 7, 71 by the method according to the invention; this is illustrated in FIGS. 2*a*, *b*. The high precision of the hot-bar selective soldering method is utilized for this purpose.

FIG. 2*a* shows a side view of a printed circuit board including centrally arranged further components 61, 62. These further components 61, 62 are, for example, SMD and/or THT components that were soldered in a shared reflow process preceding the hot-bar selective soldering process. Especially, the further components 61, 62 or their solder joint have a lower temperature resistance than the components 2, 2*b* including the high-temperature-resistant solder joint 7, 71. For each of these components 2, 2*b*, a solder preform 3, 3*b* is attached in each case on a solderable surface of the printed circuit board 1. The attachment of the solder preforms 3, 3*b* is preferably integrated into the reflow process for soldering on the further components 61, 62.

By means of a substantially automated displacement (here: movement) of the bar 4 in the plane of the printed circuit board 1, it is possible to successively create the plurality of high-temperature-resistant solder joints 7, 71 (FIG. 2*a*). For this purpose, the bar 4 is displaced in the plane of the printed circuit board 1. Alternatively or additionally, multiple bars 4 can essentially simultaneously create multiple high-temperature-resistant solder joints 7, 71 (FIG. 2*b*) in that the multiple bars 4 substantially simultaneously press on a respective solder preform 3, 3*b*-component 2, 2b pair. In FIG. 2a, the components 2, 2b including the high-temperature-resistant solder joints 7, 71 are arranged in opposing edge regions of the printed circuit board 1, whereas in FIG. 2b the components 2, 2b including the high-temperature-resistant solder joints 7, 71 adjoin one another. An example of a field device 8 including a high-temperature-resistant solder joint 7, 71 is shown in FIG. 3. In this example, which by no means limits the invention, the field device 8 is an inductively driven vibratory measuring device, namely a tuning fork, which is used as a limit switch for monitoring a predetermined fill level of a medium in a container and which is specified for high-temperature applications. Of course, it can also be another field device 8, for example a ceramic pressure sensor, which was already mentioned and is provided for a temperature range with temperatures of no more than 180° C., or another of the field devices mentioned at the outset.

The specific configuration or arrangement of the high-temperature-resistant solder joints 7, 71 on the printed circuit board 1 essentially depends on the application or the specific configuration of the particular field device 8 and its electronic unit 9, including, among other things, the materials used (for example for the housing) and their thermal conductivity, the arrangement of the electronic unit 9 in the field device 8, and/or the configuration of the electronic unit 9 itself, wherein the layout of the electronic unit 9 is generally determined by the special operating principle of the field device 8.

Only certain solder joints of the electronic unit 9 of the field device 8 are essentially directly exposed to ambient temperatures Tum of approximately 180° C. (for example by a hot process medium). These are designed as high-temperature-resistant solder joints 7, 71, which are selectively obtained by the method according to the invention. The remaining area of the printed circuit board 1, especially, the further components 61, 62 and their solder joints, are protected from thermal stress during production, since high-temperature-resistant solder joints 7, 71 can be obtained particularly quickly and in a locally delimited manner by means of the solder preform 3, 3b and the hot-bar selective soldering method.

The invention claimed is:

1. A method for creating a high-temperature-resistant, lead-free solder joint between a printed circuit board and a component, the method comprising:
   providing a lead-free solder preform, wherein the lead-free solder preform includes a composite material including a first composite component arranged in layers;
   attaching the solder preform to a solderable surface of the printed circuit board such that the layers of the first composite component are parallel to the solderable surface;
   applying the component to the solder preform attached to the solderable surface, the component having a solderable first surface facing the solder preform; and
   soldering the component to the solder preform in a hot-bar selective soldering process, the soldering including:
      pressing a bar onto a second surface of the component facing away from the solder preform;
      flowing an electric current through the bar until a predefined soldering temperature is reached in the bar, wherein at the predefined soldering temperature a first surface of the solder preform facing away from the solderable surface is soldered to the solderable first surface of the component facing the solder preform and wherein intermetallic phases are formed from the layers of the first composite component; and
      moving the bar away from the component.

2. The method according to claim 1,
wherein the predefined soldering temperature is between 250° C. and 400° C.

3. The method according to claim 2,
wherein a soldering time less than one minute is used during the hot-bar selective soldering process.

4. The method according to claim 1,
wherein the attachment of the solder preform on the solderable surface of the printed circuit board includes:
   applying soldering paste onto a designated contact surface on the solderable surface of the printed circuit board; and
   populating the designated contact surface with the solder preform.

5. The method according to claim 4,
wherein the attachment of the solder preform on the solderable surface of the printed circuit board further includes:
   soldering the solder preform to the contact surface in a soft soldering process.

6. The method according to claim 1,
wherein the attachment of the solder preform on the solderable surface of the printed circuit board includes:
   gluing the solder preform onto the solderable surface using a flux.

7. The method according to claim 1,
wherein the attachment of the solder preform can be at least partially integrated into a shared pressure and/or populating and/or reflow process in which further components, including SMD components, are soldered onto the printed circuit board.

8. The method according to claim 1,
wherein the hot-bar selective soldering process includes:
   soldering a second surface of the solder preform facing the solderable surface of the printed circuit board to the solderable surface of the printed circuit board.

9. The method according to claim 1,
wherein the first composite component includes a tin-containing solder alloy having a liquidus temperature of less than 250° C., and
wherein the solder preform further includes a second composite component including a metallic matrix.

10. The method according to claim 1, further comprising:
creating a plurality of high-temperature-resistant solder joints consecutively by displacing the bar in a plane of the printed circuit board and/or by displacing the printed circuit board, and by successively carrying out the steps of the hot-bar selective soldering process in each case with a component-solder preform pair.

11. The method according to claim 1, further comprising:
creating a plurality of high-temperature-resistant solder joints simultaneously using a plurality of bars, in that the plurality of bars essentially simultaneously carry out the steps of the hot-bar selective soldering process in each case with one bar for one component-solder preform pair.

12. A high-temperature-resistant, lead-free solder joint, comprising:
   a component;
   a printed circuit board; and
   a lead-free solder preform including a composite material including a first composite component arranged in layers, wherein the solder joint is made by:
- attaching the solder preform to a solderable surface of the printed circuit board such that the layers of the first composite component are parallel to the solderable surface;
- applying the component to the solder preform attached to the solderable surface, the component having a solderable first surface facing the solder preform; and
- soldering the component to the solder preform in a hot-bar selective soldering process, the soldering including:
  - pressing a bar onto a second surface of the component facing away from the solder preform;
  - flowing an electric current through the bar until a predefined soldering temperature is reached in the bar, wherein at the predefined soldering temperature a first surface of the solder preform facing away from the solderable surface is soldered to the solderable first surface of the component facing the solder preform and wherein intermetallic phases are formed from the layers of the first composite component; and
  - moving the bar away from the component.

13. The high-temperature-resistant, lead-free solder joint according to claim 12,
   wherein the solder joint has a plurality of intermetallic phases that are arranged in layers parallel to the solderable surface, and
   wherein the plurality of intermetallic phases of the solder joint are distributed uniformly in a direction perpendicular to the solderable surface of the printed circuit board.

14. The high-temperature-resistant, lead-free solder joint according to claim 13,
   wherein a proportion of the intermetallic phases in the solder joint is at least 5%.

15. The high-temperature-resistant lead-free solder joint according to claim 12,
   wherein the solder joint is resistant at ambient temperatures of up to 200° C.

16. A field device of automation technology for determining and/or monitoring the process variable of a medium, comprising:
   an electronic unit which includes at least one printed circuit board having electrical and/or electronic components soldered thereon, wherein a solder joint of at least one of the electrical and/or electronic components is a high-temperature-resistant, lead-free solder joint, including:
   the at least one electrical and/or electronic component;
   the at least one printed circuit board; and
   a lead-free solder preform including a composite material including a first composite component arranged in layers,
   wherein the solder joint is made by:
   - attaching the solder preform to a solderable surface of the printed circuit board such that the layers of the first composite component are parallel to the solderable surface;
   - applying the component to the solder preform attached to the solderable surface, the component having a solderable first surface facing the solder preform; and
   - soldering the component to the solder preform in a hot-bar selective soldering process, the soldering including:
     - pressing a bar onto a second surface of the component facing away from the solder preform;
     - flowing an electric current through the bar until a predefined soldering temperature is reached in the bar, wherein at the predefined soldering temperature a first surface of the solder preform facing away from the solderable surface is soldered to the solderable first surface of the component facing the solder preform and wherein intermetallic phases are formed from the layers of the first composite component; and
     - moving the bar away from the component.

* * * * *